United States Patent
Wallingford et al.

(10) Patent No.: US 9,022,327 B2
(45) Date of Patent: May 5, 2015

(54) CABLE MANAGEMENT SYSTEM

(75) Inventors: Douglas Wallingford, Georgetown, TX (US); Gregory Lane Henderson, Round Rock, TX (US); Riyad E. Moe, Temple, TX (US)

(73) Assignee: Dell Products L.P., Round Rock, TX (US)

( * ) Notice: Subject to any disclaimer, the term of this patent is extended or adjusted under 35 U.S.C. 154(b) by 1581 days.

(21) Appl. No.: 12/014,881

(22) Filed: Jan. 16, 2008

(65) Prior Publication Data

US 2009/0179119 A1    Jul. 16, 2009

(51) Int. Cl.
*F16L 3/22*        (2006.01)
*H02G 3/00*        (2006.01)
*H05K 7/14*        (2006.01)
*F16L 3/00*        (2006.01)

(52) U.S. Cl.
CPC .............. *H02G 3/26* (2013.01); *H05K 7/1491* (2013.01)

(58) Field of Classification Search
USPC .................................................. 248/68.1, 49
See application file for complete search history.

(56) References Cited

U.S. PATENT DOCUMENTS

| | | | | |
|---|---|---|---|---|
| 2,397,291 A * | 3/1946 | Robertson | ..................... | 248/68.1 |
| 3,521,332 A * | 7/1970 | Kramer | ......................... | 403/188 |
| 3,651,449 A * | 3/1972 | Hall et al. | ...................... | 439/708 |
| 3,781,761 A * | 12/1973 | Harwood | ....................... | 439/369 |
| 4,494,520 A | 1/1985 | Hurwitz | ......................... | 123/633 |
| 4,579,759 A | 4/1986 | Breuers | ......................... | 428/36 |
| 4,771,743 A | 9/1988 | McDowell | ............... | 123/143 C |
| 4,775,121 A * | 10/1988 | Carty | ........................... | 248/68.1 |
| 5,168,842 A | 12/1992 | Brooks | ..................... | 123/143 C |
| 5,319,837 A * | 6/1994 | Kujawski | ...................... | 24/16 R |
| D388,833 S | 1/1998 | Wilson | ........................... | D20/22 |
| 5,862,774 A | 1/1999 | Moss | ............................. | 116/200 |
| 5,887,837 A * | 3/1999 | Johns et al. | .................... | 248/371 |
| 6,241,200 B1 * | 6/2001 | Camporeale et al. | ........ | 248/68.1 |
| 6,375,017 B1 * | 4/2002 | Schattner et al. | .......... | 211/85.13 |
| 6,420,657 B1 | 7/2002 | Fang et al. | ..................... | 174/112 |
| D462,604 S | 9/2002 | Denton | ......................... | D8/357 |
| D468,996 S * | 1/2003 | Sarkinen et al. | .............. | D8/356 |
| 6,710,249 B1 * | 3/2004 | Denton | ......................... | 174/651 |
| 6,777,618 B2 | 8/2004 | Bond et al. | ..................... | 174/112 |
| 7,134,200 B2 | 11/2006 | Boldy | ............................. | 29/857 |
| 7,600,721 B2 * | 10/2009 | Vermeer et al. | ................. | 248/49 |
| 2009/0090550 A1 * | 4/2009 | Bird | ............................. | 174/500 |

OTHER PUBLICATIONS

Universal Wire Loom Separator Kits, Made for You, www.made4uproducts.com/universal_kits.htm, 2 pages., Nov. 17, 2008.

* cited by examiner

*Primary Examiner* — Jonathan Liu

(74) *Attorney, Agent, or Firm* — Baker Botts L.L.P.

(57) ABSTRACT

A device for managing cables for an information handling system may include a rigid but flexible body defining multiple cable retaining regions. Each of the multiple cable retaining regions may include a first portion shaped and sized to receive and retain a first type of cable having a first cross-sectional geometry, and a second portion shaped and sized to receive and retain a second type of cable having a second cross-sectional geometry different than the first cross-sectional geometry.

19 Claims, 4 Drawing Sheets

CABLE MANAGEMENT SYSTEM

TECHNICAL FIELD

The present disclosure relates in general to information handling systems, and more particularly to a system for managing cables associated with information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Any number and type of cables may be used to connect various information handling system components or to connect different information handling system to each other. For example, an information handling system (e.g., a personal computer, router, or server) may be connected to peripherals, power sources, components, or other information handling systems using cables such as Ethernet, fiber optic, Infiniband, USB, twisted pair, coaxial, power cables, or any other types of cables.

In systems that include a significant number of cable connections (e.g., a multi-blade server system), it may be necessary or desirable to be able to identify and keep track of particular cables. For example, if a group of cables need to be disconnected from one server and reattached to another server, the technician may need to keep track of which cables correspond to particular ports such that the cables may be reconnected to the proper ports. Typically, a technician may fasten tape (or other similar tag) having a number or other symbol written thereon to individual cables, such that the cables may be subsequently identified and distinguished from each other. For example, if 16 Ethernet cables are attached to a server system, a technician may fasten tape with a number (1 through 16) written thereon to each of the cables in order to keep track of the cables.

SUMMARY

In accordance with the teachings of the present disclosure, disadvantages and problems associated with managing cables have been reduced.

In accordance with one embodiment of the present disclosure, a device for managing cables for an information handling system may include a rigid but flexible body defining multiple cable retaining regions. Each of the multiple cable retaining regions may include a first portion shaped and sized to receive and retain a first type of cable having a first cross-sectional geometry, and a second portion shaped and sized to receive and retain a second type of cable having a second cross-sectional geometry different than the first cross-sectional geometry.

In accordance with another embodiment of the present disclosure, a system for managing cables for an information handling system may include first and second identical devices. Each of the two devices includes a body defining multiple cable retaining regions, each retaining region including multiple different portions shaped and sized to receive and retain different types of cables having different cross-sectional geometries. Each of the two devices also includes a first side and a second side generally opposite the first side, at least one first identifier on the first side of the device, and at least one second identifier on the second side of the device, the at least one second identifier being different than the at least one first identifier. The first device retains a first group of cables and the second device retains a second group of cables. The first and second devices are oriented such that the first side of the first device and the second side of the second device face the user, such that the first group of cables can be distinguished from the second group of cables by the different identifiers on the different sides of the first and second devices facing the user.

In accordance with a further embodiment of the present disclosure, an information handling system may include a plurality of input/output (I/O) ports, and a device for managing cables configured for connection to the plurality of I/O ports. The device may include a rigid but flexible body defining multiple cable retaining regions. Each of the multiple cable retaining regions may include a first portion shaped and sized to receive and retain a first type of cable having a first cross-sectional geometry, and a second portion shaped and sized to receive and retain a second type of cable having a second cross-sectional geometry different than the first cross-sectional geometry.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Figure 1:
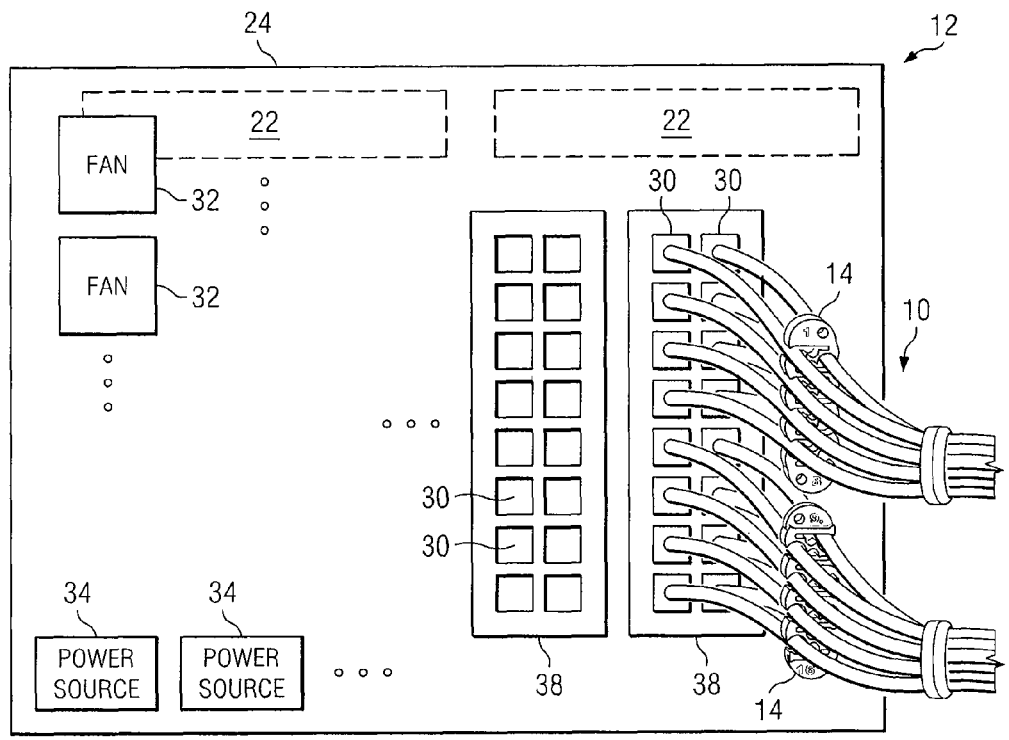
FIG. 1 illustrates a cable management system for use with an information handling system, according to embodiments of the present disclosure.

FIG. 1 illustrates a cable management system 10 for use with an information handling system 12, according to embodiments of the present disclosure. In general, cable management system 10 may include one or more cable retaining devices 14 configured to retain, organize, and/or otherwise manage one or more cables 20 associated with information handling system 12, as described below in greater detail.

Information handling system 12 may comprise any one or more information handling systems as defined above. For example, in the embodiment shown in FIG. 1, information handling system 12 comprises a multi-blade server and FIG. 1 illustrates a rear view of the multi-blade server 12. Information handling system 12 may include multiple (e.g., 16) blade servers 22 housed in an enclosure 24. Blade servers 22 may be inserted through a front side of enclosure 24, and are thus indicated by dashed lines in FIG. 1.

Information handling system 12 may include any other suitable components. For example, as shown in the rear view of FIG. 1, information handling system 12 may include one or more input/output (I/O) ports 30, fans 32, and power supplies 34.

I/O ports 30 may comprise any interface for connecting information handling system 12 to any one or more external devices (e.g., a network and/or various peripherals) and may be configured for accepting any suitable cables or connectors. For example, I/O ports 34 may include one or more Ethernet, fiber optic, Infiniband, USB, PS/2, LAN, PCI, PCI-X, PCMCIA, IEEE 1394, Bluetooth, Token-Ring, xDSL, FDDI, ATM, RJ-48, RJ-45, twisted pair, coaxial, serial, parallel, keyboard, mouse, modem, speaker, line-in, line-out, or any other type of ports.

Information handling system 12 may include any number and combination of individual I/O ports 30 or groups of I/O ports 30. In some embodiments, I/O ports 30 may be grouped in I/O modules 38, which may include any number of I/O ports 30. In some systems, an I/O module 34 may comprise an active or passive switch for switching and/or routing communications to and from multiple blade servers 22, or a pass-through module providing an interface for directly communicating data (i.e., "passing through") to one or more blade servers 22.

In one example embodiment, information handling system 12 includes six I/O modules 38, including two Ethernet I/O modules 38 (each including 1-16 Ethernet ports 30), two Infiniband I/O modules 38 (each including 1-16 Infiniband ports 30), and two Fiber Channel I/O modules 38 (each including 1-16 fiber optic ports 30), for a total of six I/O modules 38.

Each I/O port 30 is generally configured to receive one or more cables 40. Cables 40 may include cables, wires, or any other conduits for communicating data or electricity. For example, cables 40 may include one or more Ethernet, fiber optic, Infiniband, USB, PS/2, LAN, PCI, PCI-X, PCMCIA, IEEE 1394, Bluetooth, Token-Ring, XDSL, FDDI, ATM, RJ-48, RJ-45, twisted pair, coaxial, keyboard, mouse, modem, or speaker cables or wires. Cables 40 may also include power cables or system bus cables.

Cable management system 10 is generally operable to manage cables 40. "Managing" cables may include physically securing, physically supporting, organizing, ordering, labeling, or otherwise managing cables. For example, cable management system 10 may physically support and organize multiple groups of cables 40 for multiple I/O modules 38. As discussed below, cable management system 10 may also label cables 40 such that cables 40 can be identified and/or distinguished from each other.

As shown in FIG. 1, cable management system 10 may include one or more cable retaining devices 14 to manage cables 40. Each cable retaining device 14 may be configured to manage any suitable number of cables 40. For example, in particular embodiments for use with I/O modules 38, cable retaining devices 14 may be configured to manage a number of cables 40 equal to, or a fraction of, the number of I/O ports 30 in one or more I/O modules 38. For instance, cable retaining device 14 may be configured to manage 4, 8, or 16 of each type of cable 40 for convenient use with I/O modules 38 having 16 I/O ports 30. However, in other embodiments, cable retaining device 14 may be configured to manage any other number of cables 40.

Figure 2A:
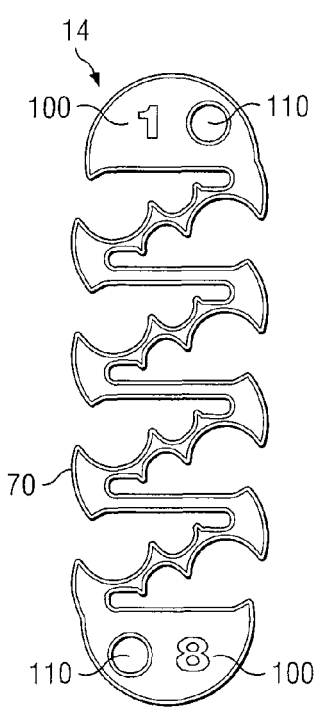
FIGS. 2A-2E illustrate various views of an example cable retaining device, according to one embodiment of the present disclosure.
Figure 2B:
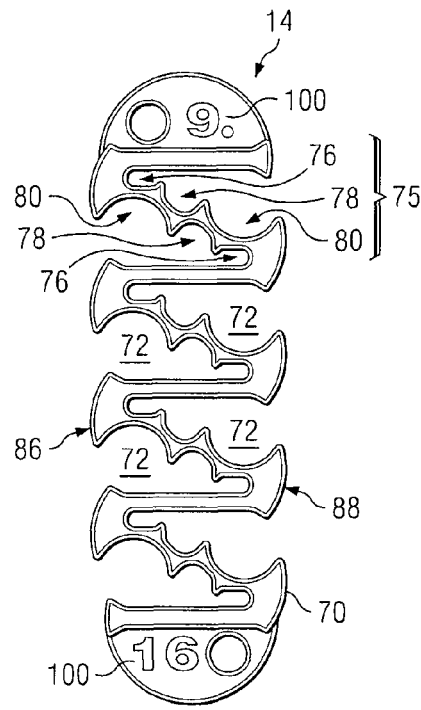
Figure 2C:
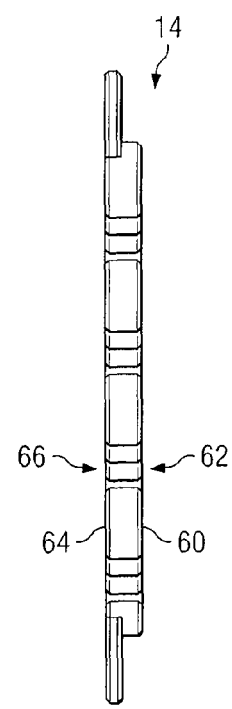
Figure 2D:
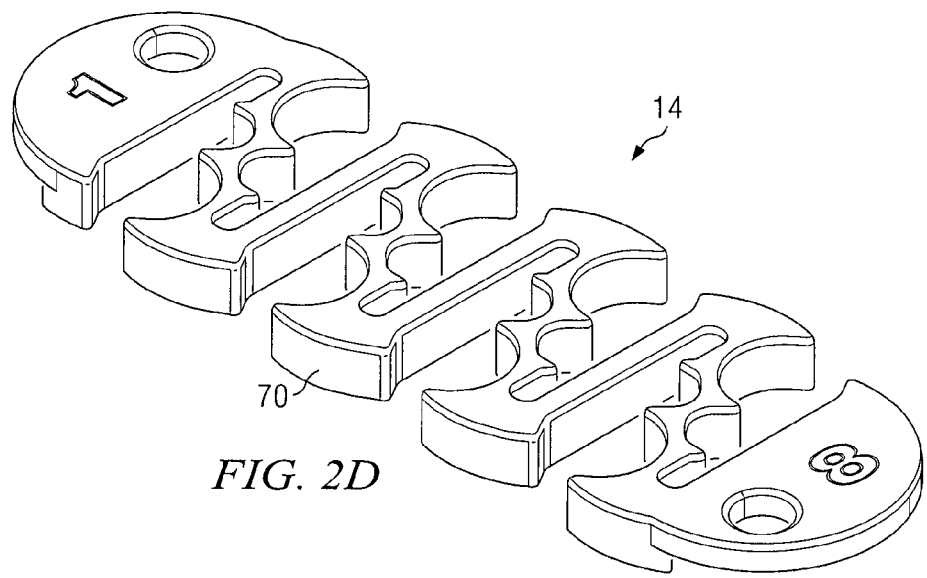
Figure 2E:
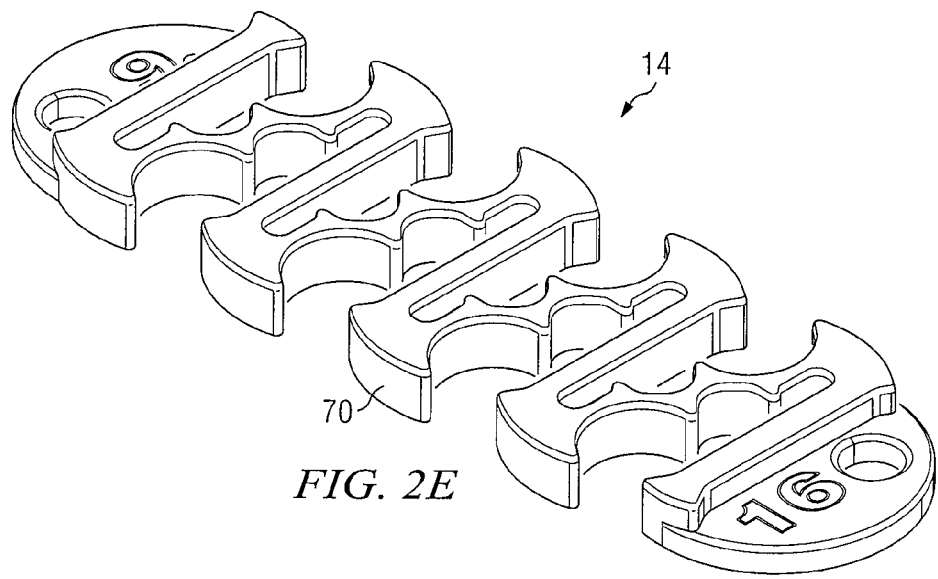

FIGS. 2A-2E illustrate various views of an example cable retaining device 14, according to one embodiment of the present disclosure. FIGS. 2A and 2B illustrate front and rear views, FIG. 2C illustrates a side view, and FIGS. 2D and 2E illustrate three-dimensional front and rear views of cable retaining device 14. More particularly, FIG. 2A illustrates a view of a first side 60 of cable retaining device 14, viewed along direction 62 shown in FIG. 2C. Similarly, FIG. 2B illustrates a view of a second side 64 of cable retaining device 14, viewed along direction 66 shown in FIG. 2B. FIGS. 2D and 2E illustrate three-dimensional views of the first side 60 and second side 64, respectively, of cable retaining device 14.

Cable retaining device 14 includes a body 70 defining multiple cable retaining regions 72 for receiving and/or retaining cables 40. Body 70 may define any suitable number of cable retaining regions 72. Each cable retaining region 72 may include one or more shaped portions 75 for receiving and/or retaining one or more different types of cables 40 having different cross-sectional geometries. Each shaped portion 75 may be shaped and/or sized to receive and/or retain one or more particular types of cables 40.

In the illustrated example, body 70 includes eight cable retaining regions 72, and each cable retaining region 72 includes three shaped portions 76, 78, and 80 having different cross-sectional geometries. Shaped portions 76 are shaped and sized to receive and retain fiber optic cables, shaped portions 78 are shaped and sized to receive and retain Ethernet cables, and shaped portions 80 are shaped and sized to receive and retain Infiniband cables. In other embodiments, each cable retaining region 72 may other number of shaped portions shaped and sized to receive and/or retain any number of different types of cables 40.

Cable retaining regions 72 and/or shaped portions 75 may be oriented in any suitable manner. For example, cable retaining regions 72 and/or shaped portions 75 may be aligned linearly, radially (e.g., as discussed below regarding FIG. 5), or in another manner. In the illustrated example, cable retaining regions 72 are aligned generally linearly, in a zig-zag pattern such that cable retaining regions 72 alternate from a first side 86 to a second side 88 of body 70. Thus, four of the eight cable retaining regions 72 open to first side 86 of body 70, while the other four cable retaining regions 72 open to second side 88 of body 70. In other embodiments, all cable retaining regions 72 may open to the same side of body 70.

In the illustrated example, shaped portions 76, 77, and 78 are aligned in linear rows. More particularly, shaped portions 76 are arranged in two parallel rows of four, shaped portions 78 are arranged in two parallel rows of four, and shaped portions 80 are arranged in two parallel rows of four.

In some embodiments, cable retaining regions 72 may be configured such that the alignment of shaped portions 75 correspond with the alignment of I/O ports 30 in an I/O module 38. For example, as discussed above, each of shaped portions 76, 77, and 78 are arranged in a two-by-four configuration, which corresponds with an I/O module 38 having 16 I/O ports 30 arranged in a two-by-eight configuration. Thus, as shown in FIG. 1, two cable retaining device 14 having a two-by-four configuration may be used in an end-to-end arrangement to align with the two-by-eight configuration of I/O ports 30 in an I/O module 38.

Cable retaining device 14 may receive and retain cables 40 in cable retaining regions 72 in any suitable manner. In some embodiments, body 70 may flex to receive cables 40 in shaped portions 75 of cable retaining regions 72. For example, in the illustrated embodiment, the opening for each shaped portion 75 is slightly smaller than the cable 40 intended to be received in that shaped portion 75. Thus, body 70 may be flexed to increase the opening size of the shaped portion 75 such that a cable 40 may be received in that shaped portion 75. Once the cable 40 is received in the shaped portion 75, body 70 may spring back its original unflexed (or less flexed) shape. The force of body 70 flexing back toward its unflexed shape acts to retain the cable 40 in the shaped portion 75. The cable 40 may be removed from the shaped portion 75 using sufficient force to overcome the spring force of body 70.

Thus, in the illustrated embodiment, body 70 may be formed from any one or more rigid but flexible materials. For example, body 70 may be formed from a polycarbonate/ABS blend (PC/ABS) or other polycarbonate. In other embodiments, body 70 may be formed from other plastics, metals, or other suitable materials.

In other embodiments, cable retaining device 14 may include clips, latches, or other retaining devices to physically restrain cables 40 in cable retaining regions 72, e.g., as discussed below with reference to FIGS. 3 and 4.

Cable retaining device 14 may include one or more identifiers 100 for labeling cables 40 retained by device 14. Device 14 may include identifiers 100 corresponding to particular shaped portions 75, to particular cable retaining regions 72, to a particular side or portion of device 14, or to a particular device 14. Identifiers 100 may include any numbers, letters, words, characters, symbols, shapes, or other identifiers. Identifiers 100 may be useful for identifying individual cables 40 or groups of cables 40, e.g., such that when a group of cables 40 is disconnected from an I/O module 38, the cables 40 can still be identified and/or distinguished from other cables 40 (e.g., another similar group of cables 40).

In the embodiment shown in FIGS. 2A-2E, device 14 includes identifiers 100 located on tabs on each end of body 70, and on each side 60 and 64 of body 70. In particular, numbers "1" and "8" are located on tabs on first side 60 of body 70 (see FIGS. 2A and 2D), and numbers "9 and "16" are located on tabs on second side 64 of body 70 (see FIGS. 2B and 2E). Thus, device 14 can be used to identify a group of cables as cables 1-8 by orienting device 14 such that first side 60 faces a certain direction, or to identify a group of cables as cables 9-16 by orienting device 14 such that second side 64 faces the certain direction. Thus, a user can identify 16 cables as cables 1-16 by using two devices 14 together, with one device facing one way such that indicators 100 indicate cables 1-8 and the other device facing the other way such that indicators 100 indicate cables 9-16. Such system of identification may be useful, e.g., for distinguishing groups of cables 40 from each other when cables 40 are connected or disconnected from I/O modules 38.

Cable retaining device 14 may also include one or more holes 110 or other structure for securing device 14 to another structure, e.g., a component or structure of an information handling device (e.g., a structure of a server chassis). For example, a wire, clip, or band may be run through a hole 110 and around another structure to secure device 14 to that structure. Securing device 14 to another structure may be helpful for managing cables 40, as well as reducing the stresses on the connections between cables 40 and I/O ports 30.

Figure 3:
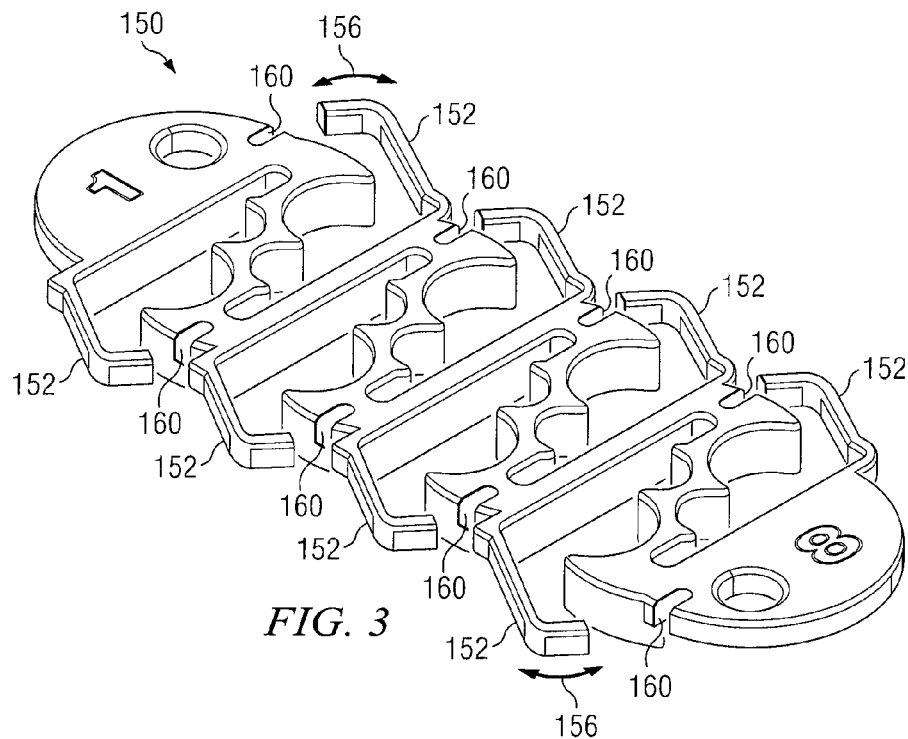
FIG. 3 illustrates an example cable retaining device having latches for restraining cables, in accordance with one embodiment of the disclosure.

FIG. 3 illustrates an example cable retaining device 150 having latches for restraining cables, in accordance with one embodiment of the disclosure. Cable retaining device 150 is generally similar to cable retaining device 14, but includes latches 152 for restraining cables 40 in cable retaining regions 72. In this embodiment, each cable retaining regions 72 includes a latch 152. Latch 152 is flexible to move in the directions indicated by arrow 156. Each latch 152 may be received and hooked in a notch 160. Latch 152 and notch 160 may be shaped and sized such that latch 152 may be manually hooked into and released from notch 160 by hand.

Figure 4:
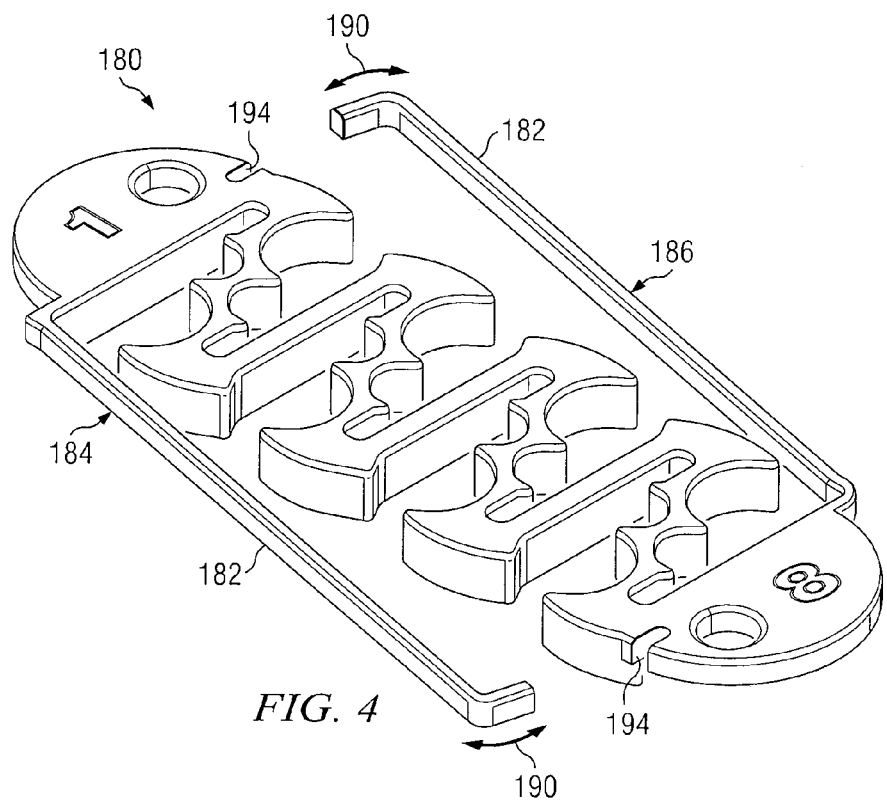
FIG. 4 illustrates another example cable retaining device having latches for restraining cables, in accordance with another embodiment of the disclosure.

FIG. 4 illustrates another example cable retaining device 180 having latches for restraining cables, in accordance with another embodiment of the disclosure. Cable retaining device 180 is generally similar to cable retaining device 14, but includes latches 182 for restraining cables 40 in cable retaining regions 72. In this embodiment, one latch 182 is provided on each side 184 and 186 of device 180. Thus, each latch 182 can be used for restraining cables 40 in all four cable retaining regions 72 that open to the respective side 184, 186 of device 180. Each latch 182 is flexible to move in the directions indicated by arrows 190. Each latch 190 may be received and hooked in a notch 194. Latch 190 and notch 194 may be shaped and sized such that latch 190 may be manually hooked into and released from notch 194 by hand.

Figure 5:
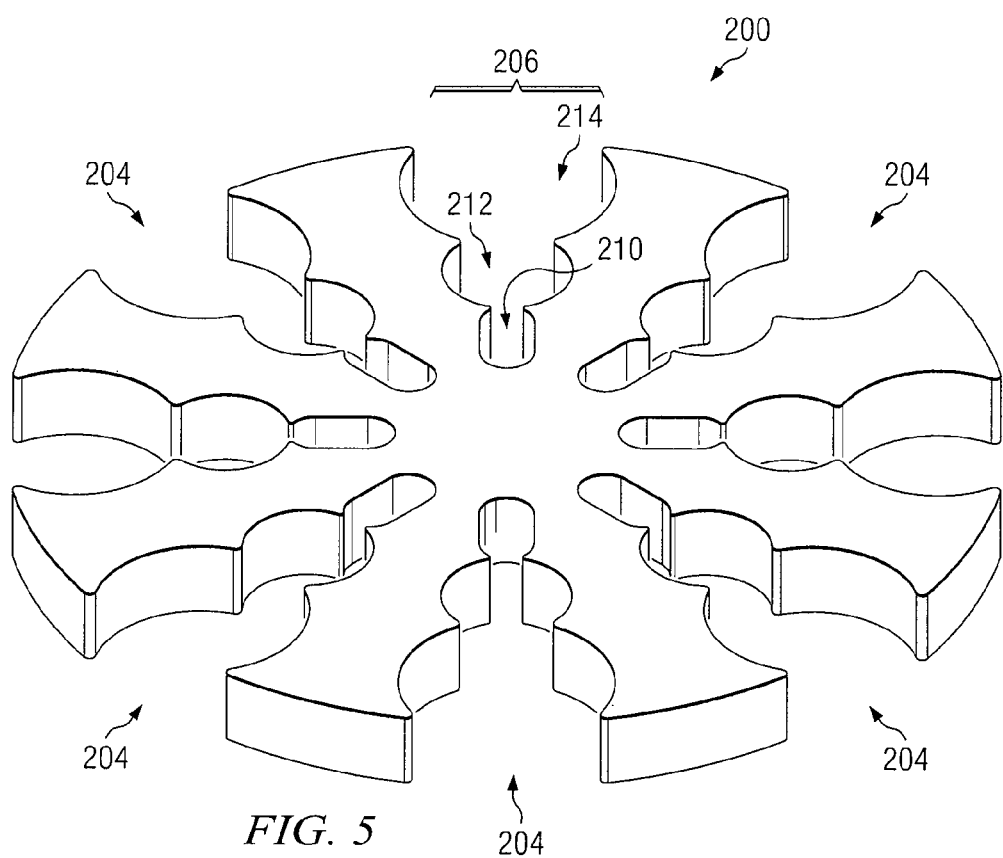
FIG. 5 illustrates an example cable retaining device having a radial shape, according to one embodiment of the present disclosure.

FIG. 5 illustrates an example cable retaining device 200 having a radial shape, according to one embodiment of the present disclosure. Cable retaining device 200 has a generally radially shaped body 202 that defines eight cable retaining regions 204 for receiving and/or retaining cables 40. Body 202 may define any suitable number of cable retaining regions 204. Each cable retaining region 204 may include one or more shaped portions 206 for receiving and/or retaining one or more different types of cables 40 having different cross-sectional geometries. Each shaped portion 206 may be shaped and/or sized to receive and/or retain one or more particular types of cables 40.

In the illustrated example, body 202 includes eight cable retaining regions 204, and each cable retaining region 204 includes three shaped portions 210, 212, and 214 having different cross-sectional geometries. Shaped portions 210 are shaped and sized to receive and retain fiber optic cables, shaped portions 212 are shaped and sized to receive and retain Ethernet cables, and shaped portions 214 are shaped and sized to receive and retain Infiniband cables. In other embodiments, each cable retaining region 204 may other number of shaped portions shaped and sized to receive and/or retain any number of different types of cables 40.

Cable retaining regions 204 and shaped portions 206 are aligned radially and spaced around a perimeter of body 202. Similar to device 14, cable retaining device 200 may receive and retain cables 40 in cable retaining regions 204 in any suitable manner. In some embodiments, body 202 may flex to receive cables 40 in shaped portions 206. For example, in the illustrated embodiment, the opening for each shaped portion 206 is slightly smaller than the cable 40 intended to be received in that shaped portion 206. Thus, body 202 may be flexed to increase the opening size of the shaped portion 206 such that a cable 40 may be received in that shaped portion 206. Once the cable 40 is received in the shaped portion 206, body 202 may spring back its original unflexed (or less flexed) shape. The force of body 202 flexing back toward its unflexed shape acts to retain the cable 40 in the shaped portion 206. The cable 40 may be removed from the shaped portion 206 using sufficient force to overcome the spring force of body 202.

Thus, body 202 may be formed from any one or more rigid but flexible materials. For example, body 202 may be formed from a polycarbonate/ABS blend (PC/ABS) or other polycarbonate. In other embodiments, body 202 may be formed from other plastics, metals, or other suitable materials.

In addition, as discussed above regarding device 14, device 200 may include holes (e.g., similar to holes 110) or other structures for securing device 200 to another structure; identifiers (e.g., similar to identifiers 100) for identifying and/or distinguishing particular cables 40; and/or latches or other similar devices for restraining cables 40 in cable retaining regions 204.

Although the present disclosure has been described in detail, it should be understood that various changes, substitutions, and alterations can be made hereto without departing from the spirit and the scope of the invention as defined by the appended claims.

What is claimed is:

1. A device for managing cables for an information handling system, comprising:
    a rigid but flexible body defining multiple cable retaining regions, each of the multiple cable retaining regions including:
        a first portion shaped and sized to receive and retain a first type of cable having a first cross-sectional geometry; and
        a second portion shaped and sized to receive and retain a second type of cable having a second cross-sectional geometry different than the first cross-sectional geometry.

2. A device according to claim 1, wherein the first type of cable comprises a fiber optic cable, and the second type of cable comprises an Ethernet cable.

3. A device according to claim 1, wherein each of the multiple cable retaining regions further includes:
    a third portion shaped and sized to receive and retain a third type of cable having a first cross-sectional geometry.

4. A device according to claim 1, wherein the multiple cable retaining regions are arranged such that the first portions of at least three cable retaining regions are aligned linearly.

5. A device according to claim 1, wherein:
    the body defines a first side and a second side; and
    the multiple cable retaining regions are arranged such that:
        a first group of the multiple cable retaining regions can receive cables via the first side of the body but not via the second side; and
        a second group of the multiple cable retaining regions can receive cables via the second side of the body but not via the first side.

6. A device according to claim 1, wherein the body includes an elongated zig-zag portion that defines the multiple cable retaining regions on alternating sides of the body.

7. A device according to claim 1, further comprising one or more identifiers for labeling cables retained by the device.

8. A device according to claim 1, further comprising:
    a first side and a second side generally opposite the first side;
    a first identifier on the first side of the device; and
    a second identifier on the second side of the device, the second identifier being different than the first identifier such that when the device is used to retain a group of cables, a user may label the group of cables with either the first identifier or the second identifier by selecting the orientation of the device.

9. A device according to claim 1, further comprising:
    a first side and a second side generally opposite the first side;
    first and second numeric identifiers on the first side of the device, the first and second numeric identifiers defining a range of numbers corresponding to the multiple cable retaining regions defined by the device body;
    third and fourth numeric identifiers on the second side of the device, the third and fourth numeric identifiers different than the first and second numeric identifiers but also defining a range of numbers corresponding to the multiple cable retaining regions defined by the device body;
    wherein the third and fourth numeric identifiers are different than the first and second numeric identifiers such that when the device is used with a second similar device, a first group of cables retained by the first device oriented such that the first side faces the user may be differentiated from a second group of cables retained by the second similar device oriented such that the second side faces the user.

10. A device according to claim 1, further comprising one or more holes for receiving a securing device for securing the device to a support structure.

11. A device according to claim 1, wherein:
    the body is shaped generally radially; and
    the multiple cable retaining regions are spaced around a perimeter of the body.

12. A system for managing cables for an information handling system, comprising:
    first and second identical devices, each device comprising:
        a body defining multiple cable retaining regions, each of the multiple cable retaining regions including multiple different portions shaped and sized to receive and retain different types of cables having different cross-sectional geometries;
        a first side and a second side generally opposite the first side;
        at least one first identifier on the first side of the device; and
        at least one second identifier on the second side of the device, the at least one second identifier being different than the at least one first identifier;
    wherein the first device retains a first group of cables and the second device retaining a second group of cables; and wherein the first and second devices are oriented such that the first side of the first device and the second side of the second device face the user, such that the first group of cables can be distinguished from the second group of cables by the different identifiers on the different sides of the first and second devices facing the user.

13. A system according to claim 12, wherein each device further comprises:
   first and second numeric identifiers on the first side of the device, the first and second numeric identifiers defining a range of numbers corresponding to the multiple cable retaining regions defined by the device body; and
   third and fourth numeric identifiers on the second side of the device, the third and fourth numeric identifiers different than the first and second numeric identifiers but also defining a range of numbers corresponding to the multiple cable retaining regions defined by the device body;
   wherein the third and fourth numeric identifiers arte different than the first and second numeric identifiers.

14. A system according to claim 12, wherein each cable retaining region defined by the body of each device includes at least three different portions shaped and sized to receive and retain three different types of cables having different cross-sectional geometries.

15. A system according to claim 14, wherein the three different types of cables include fiber optic cables, Ethernet cables, and Infiniband cables.

16. A system according to claim 12, wherein the body of each device includes an elongated zig-zag portion that defines the multiple cable retaining regions on alternating sides of the body.

17. An information handling system, comprising:
   a plurality of input/output (I/O) ports;
   a device for managing cables configured for connection to the plurality of I/O ports, the device including:
      a rigid but flexible body defining multiple cable retaining regions, each of the multiple cable retaining regions including:
         a first portion shaped and sized to receive and retain a first type of cable having a first cross-sectional geometry; and
         a second portion shaped and sized to receive and retain a second type of cable having a second cross-sectional geometry different than the first cross-sectional geometry.

18. An information handling system according to claim 17, wherein:
   the body of the device defines a first side and a second side; and
   the multiple cable retaining regions of the device are arranged such that:
      a first group of the multiple cable retaining regions can receive cables via the first side of the body but not via the second side; and
      a second group of the multiple cable retaining regions can receive cables via the second side of the body but not via the first side.

19. An information handling system according to claim 17, wherein the device further includes:
   a first side and a second side generally opposite the first side;
   a first identifier on the first side of the device; and
   a second identifier on the second side of the device, the second identifier being different than the first identifier such that when the device is used to retain a group of cables, a user may label the group of cables with either the first identifier or the second identifier by selecting the orientation of the device.

* * * * *